United States Patent
Gong et al.

(10) Patent No.: US 8,216,918 B2
(45) Date of Patent: Jul. 10, 2012

(54) METHOD OF FORMING A PACKAGED SEMICONDUCTOR DEVICE

(75) Inventors: Zhiwei Gong, Chandler, AZ (US); Scott M. Hayes, Chandler, AZ (US); George R. Leal, Cedar Park, TX (US); Douglas G. Mitchell, Tempe, AZ (US); Jason R. Wright, Chandler, AZ (US); Jianwen Xu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/842,562

(22) Filed: Jul. 23, 2010

(65) Prior Publication Data

US 2012/0021565 A1 Jan. 26, 2012

(51) Int. Cl.
*H01L 21/00* (2006.01)
*H01L 21/322* (2006.01)
(52) U.S. Cl. .......................... 438/464; 438/106; 438/108
(58) Field of Classification Search .................. 438/106, 438/108, 109; 1/106, 108, 464
See application file for complete search history.

(56) References Cited

U.S. PATENT DOCUMENTS

| | | | |
|---|---|---|---|
| 6,838,776 B2 | 1/2005 | Leal et al. | |
| 6,921,975 B2 | 7/2005 | Leal et al. | |
| 7,078,788 B2 | 7/2006 | Vu et al. | |
| 7,361,987 B2 | 4/2008 | Leal et al. | |
| 7,579,690 B2* | 8/2009 | Chia | 257/723 |
| 7,843,071 B2* | 11/2010 | Jobetto | 257/773 |
| 7,880,296 B2* | 2/2011 | Wong et al. | 257/700 |
| 2007/0111398 A1* | 5/2007 | Hsu | 438/125 |
| 2007/0212865 A1 | 9/2007 | Amrine et al. | |
| 2008/0119004 A1 | 5/2008 | Burch et al. | |
| 2008/0119015 A1 | 5/2008 | Mangrum et al. | |
| 2008/0186690 A1* | 8/2008 | Miettinen et al. | 361/761 |
| 2008/0237836 A1* | 10/2008 | Chia et al. | 257/698 |
| 2009/0032933 A1 | 2/2009 | Tracht et al. | |
| 2009/0051024 A1* | 2/2009 | Chia | 257/686 |
| 2009/0085192 A1* | 4/2009 | Hsu et al. | 257/700 |
| 2009/0127686 A1* | 5/2009 | Yang et al. | 257/686 |
| 2009/0133251 A1 | 5/2009 | Tuominen et al. | |
| 2010/0002406 A1* | 1/2010 | Hsu | 361/764 |
| 2010/0078655 A1* | 4/2010 | Yang | 257/81 |
| 2010/0103634 A1* | 4/2010 | Funaya et al. | 361/761 |
| 2011/0215464 A1* | 9/2011 | Guzek et al. | 257/737 |
| 2011/0241222 A1* | 10/2011 | Sezi et al. | 257/782 |
| 2011/0317383 A1* | 12/2011 | Guzek | 361/764 |

* cited by examiner

*Primary Examiner* — James Mitchell
(74) *Attorney, Agent, or Firm* — James L. Clingan, Jr.

(57) ABSTRACT

A method is used to form a packaged semiconductor device. A semiconductor device, which has an active surface, is placed in an opening of a circuit board. The circuit board has a first major surface and a second major surface having the opening, first vias that extend between the first major surface and the second major surface, first contact pads terminating the vias at the first major surface, and second contact pads terminating the vias at the second major surface. A dielectric layer is applied over the semiconductor device and the second major surface of the circuit board. An interconnect layer is formed over the dielectric layer. The interconnect layer has second vias electrically connected to the second contact pads, third vias that are electrically connected to the active surface of the semiconductor device, an exposed surface, and third contact pads at the exposed surface.

5 Claims, 7 Drawing Sheets

METHOD OF FORMING A PACKAGED SEMICONDUCTOR DEVICE

BACKGROUND

1. Field

This disclosure relates generally to forming semiconductor devices, and more specifically, to forming semiconductor packages having more than one device.

2. Related Art

It is desirable to provide semiconductor packages that have multiple devices. One manufacturing process includes forming electrical contacts on both sides of a substrate (i.e., double sided build up or 3D (three dimensional) structure). To form a 3D structure, thru vias are formed within a substrate to provide connections between the top surface and the bottom surface of a substrate. The thru vias are difficult to manufacture and may have electrical and mechanical weaknesses. During the build up process, residual stresses are created, which causes panel to undesirably warp. In addition, the cost of the double sides build up is high due to the many processing steps of the process. Hence, a need exists for a method to form a 3D structure, that does not have the disadvantages of the prior art.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A method for forming packaged semiconductor devices as described herein is particularly useful for forming redistributed chip package (RCP) or similar embedded wafer level packages, which are packages that are expected to replace many ball grid array (BGA) and flip chip packages. In one embodiment, a prefabricated substrate having circuits on both sides, vias interconnecting the circuits, and a cavity opening for receiving a die is used. A tape or similar material can be used during processing to protect a surface of the packaged semiconductor die that is later exposed and connected to another electrical device. In one embodiment, a photolythic material is used to encapsulate the die.

Figure 1:
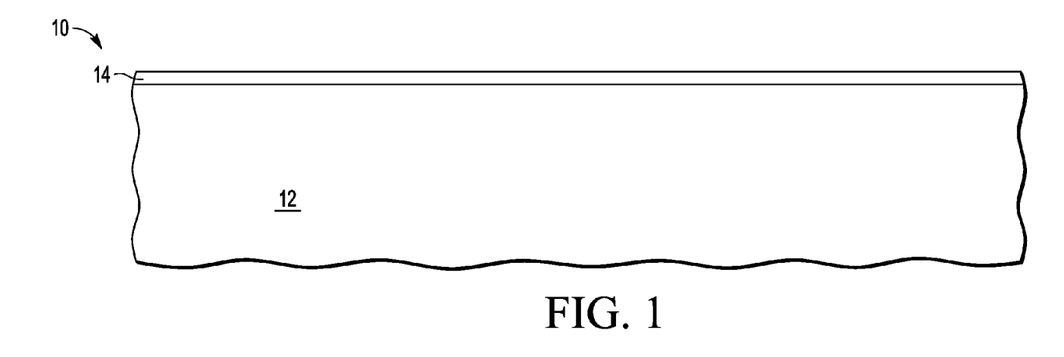
FIG. 1 illustrates a cross-section of a starting point for forming a semiconductor device in accordance with an embodiment.

FIG. 1 illustrates a cross-section of a starting point for forming a packaged semiconductor device 10 in accordance with an embodiment. The semiconductor device at this point includes a carrier 12 and tape 14. The carrier 12 may be a ceramic plate or another material that has a coefficient of thermal expansion (CTE) close to that of a substrate 11 that will be described after further discussion. The carrier 12 is a mechanical support during processing and may not be present if not needed for handling during the process. In one embodiment, the double-sided tape 14 may have different types of adhesive on each side, such as a tape with a different silicon adhesive on each side. If the carrier 12 is not present, then the tape 14 is a single sided tape. As will be appreciated after further discussion, instead of the tape 14 any other material that can both i) attach a mechanical support, such as the carrier, to a substrate 11 and ii) release the substrate after further processing from the mechanical support can be used.

Figure 2:
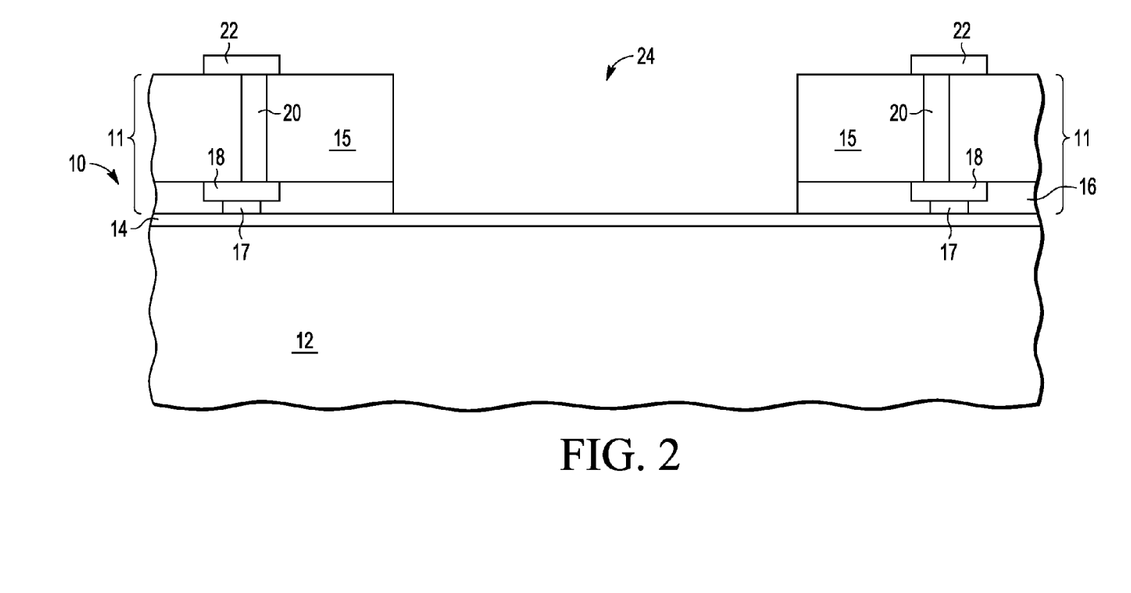
FIG. 2 illustrates the starting point of the semiconductor device of FIG. 1 after attaching a substrate having a cavity in accordance with an embodiment.

A substrate 11 is attached to the carrier 12 using the tape 14, as illustrated in FIG. 2. In one embodiment, the substrate 11 is a circuit board that has a first major surface and a second major surface with first vias running between the first major surface and the second major surface. The substrate 11 includes a solder mask 16 with openings 17 within the solder mask 16, exposed contact pads 18 within the solder mask 16 and vias 20 within the bulk material 15. The bulk material 15 may be any suitable material, such as a glass fiber reinforced insulation material. Vias 20 may be formed by any suitable technique, such as mechanical or laser drilling followed by a fill or plating and planarization process. The vias 20 couple the contact pads 18 to contact pads 22 that are formed on top of the bulk material 15. The contact pads 22, vias 20 and contact pads 18 form interconnects in the substrate 11. Routing may be formed on the surfaces of the substrate 11 so that the contact pads 18 and 22 are formed at desired locations. The contact pads 22, vias 20 and contact pads 18 are conductive materials, and in one embodiment, include copper or any suitable conductive material. The substrate 11 also includes a cavity 24. Cavity 24 like the contact pads 22, vias 20 and contact pads 18, and openings 17 are formed in the substrate 11 (i.e., "pre-formed") before the substrate 11 is attached to the carrier 12 through the tape 14. The cavity 24 is wider than the semiconductor device that will be placed into the cavity in subsequent processing. The solder mask 16 is adjacent a first major surface of the substrate 11 and the contact pads 22 are on the second major surface of the substrate 11, which is opposite the first major surface.

Figure 3:
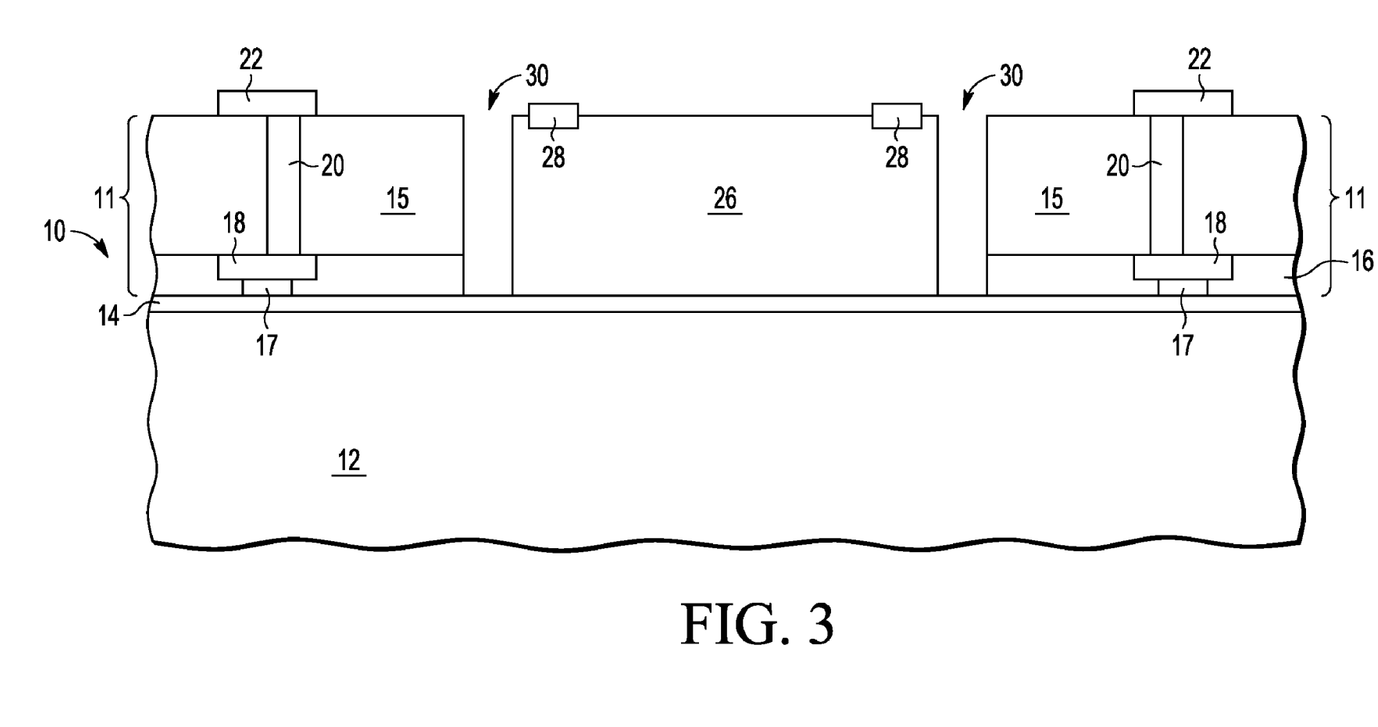
FIG. 3 illustrates the semiconductor device of FIG. 2 after placing a semiconductor device in the cavity with active side up in accordance with an embodiment.

FIG. 3 illustrates the packaged semiconductor device 10 of FIG. 2 after placing the die 26 in the cavity 24. The die 26 can be any semiconductor device, such as a logic or memory device, a resistor, the like, or combinations of the above. The die 26 includes contacts 28, of which two are illustrated by example. The contacts 28 are formed on the active surface (i.e., the surface having electrical devices) of the die 26. The contacts 28 are conductive and may include copper or any suitable conductive material. The die 26 may be placed into the cavity 24 using a pick-and-place tool used in the industry. In one embodiment, it is desirable that the die (including the contacts 28) are coplanar with the top of the substrate 11 (including the contact pads 22) so that subsequently formed layers are substantially level. The die 26 is placed so that the active surface is exposed, which in the FIG. 2 is in the up position (i.e., towards the top of the page). As shown in the illustrated embodiment, the bottom surface of the die 26 is directly in contact with tape 14. Because the cavity 24 is wider than the die 26 and the die 26 is placed in the cavity 24 so that the sides are not in physical contact with the bulk material 15 of the substrate 11, openings or cavities 30 are formed on either side of the die 26. The cavities 30, as will be better understood after further discussion, are wide enough so that they can be filled with a dielectric material during subsequent processing.

Figure 4:
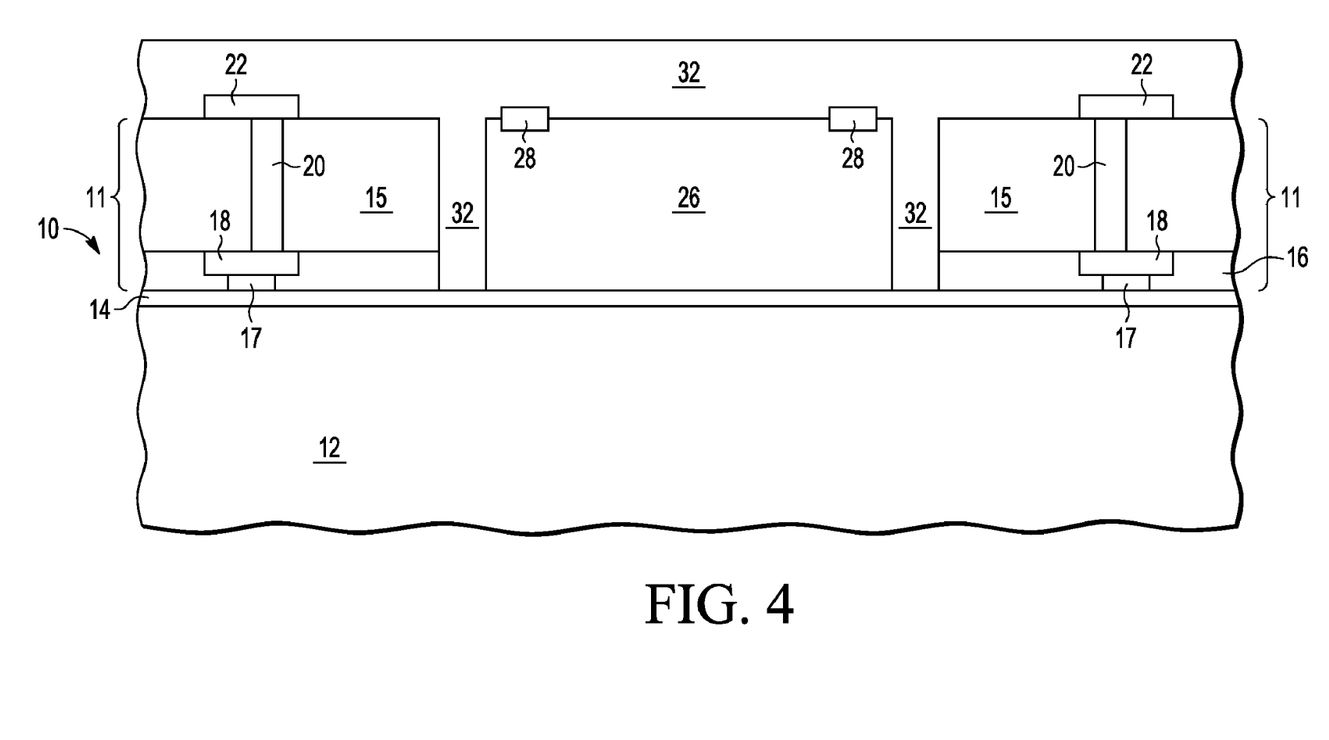
FIG. 4 illustrates the semiconductor device of FIG. 3 after filling cavities and forming a layer over the die in accordance with an embodiment.

FIG. 4 illustrates the packaged semiconductor device 10 of FIG. 3 after filling the cavities 30 and forming a layer over the die in accordance with an embodiment. In one embodiment, a photo-definable material, such as a photolytic material 32, is formed in the cavities 30 and over the substrate 11 and die 26 by deposing the photolytic material in liquid form. For example, a screen printing process could be used. In one embodiment, the photolytic material 32 is Taiyo PSR4000 AUS-7. Using this photolytic material, it flows around the die 26 so that it is between sidewalls of the die 26 and sidewalls of the cavities 30. The photolytic material 32 also encapsulates the die 26 without having to use any protective tape, which is commonly used in the prior art processes. After screen printing, a pre-cure process may be performed at approximately 80 degrees Celsius for approximately 20 to approximately 30 minutes, so that the material is dried. Other suitable dielectric materials can also be used. In one embodiment, the cavities 30 are filled during one process and the layer over the die 26 and the substrate 11 is formed during a subsequent process; different materials may or may not be used for the different processes.

Figure 5:
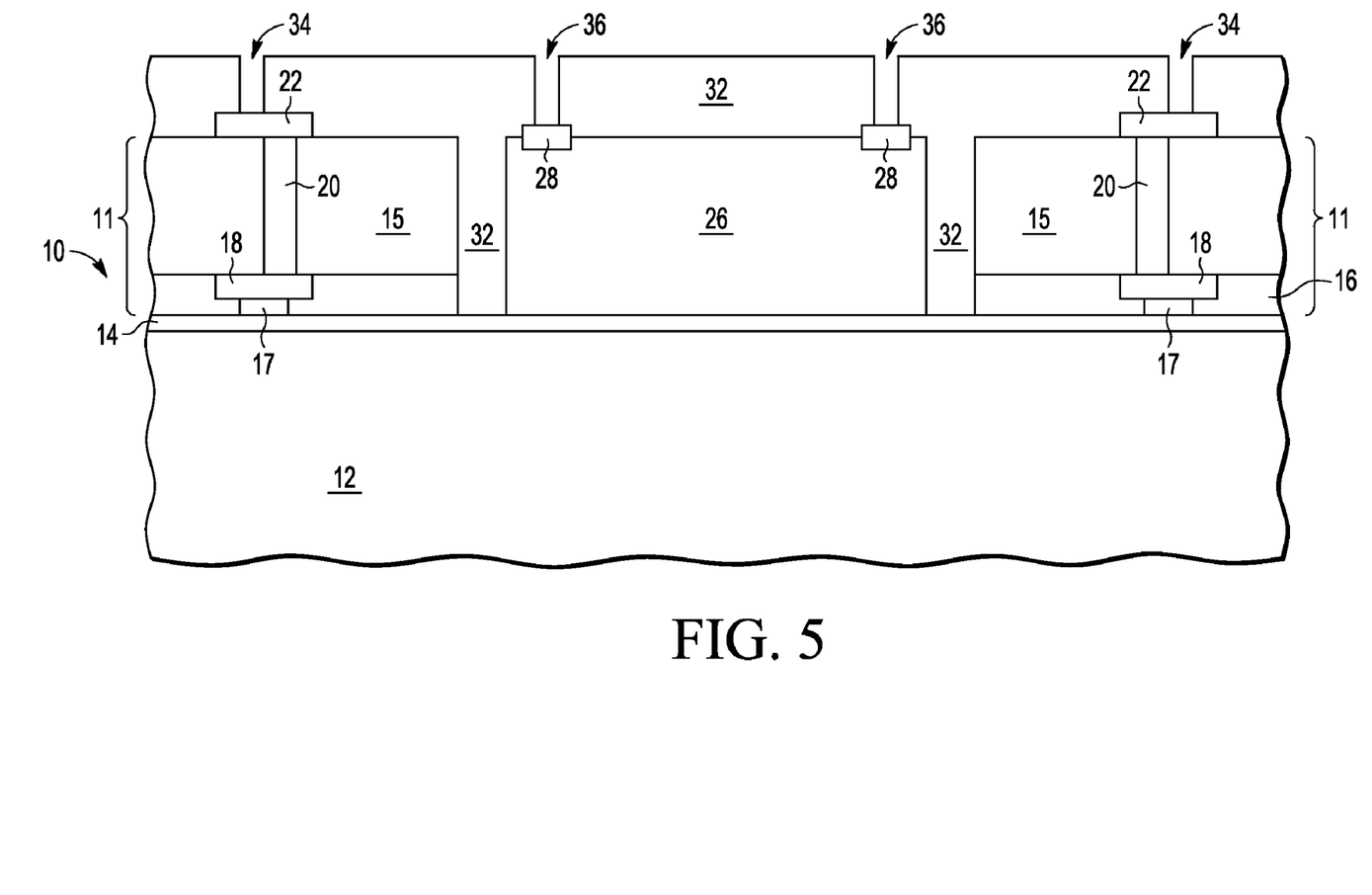
FIG. 5 illustrates the semiconductor device of FIG. 4 after patterning the layer over the die and substrate in accordance with an embodiment.

Next, the photolytic material 32 over the die 26 and the substrate 11 is patterned in one embodiment as illustrated in FIG. 5. A selective exposure process may be used to pattern the photolytic material 32. In one embodiment, typical photolithography steps are used. The patterning will form openings 34 to expose the contact pads 22 of the substrate 11 for electrical connection to another device and openings 36 to expose contacts 28 of the die 26 so that signals can be sent to and from the die and other devices to be formed or devices or signals external to the packaged semiconductor device 10. After patterning (exposure and developing), a post-cure process may be performed to harden the material. In one embodiment, the post-cure is approximately 50 to approximately 60 minutes long and is performed at approximately 150 degrees Celsius. Hence, the vias 34 and 36 are formed without having to perform drilling and planarization steps, which are cumbersome and can damage the substrate.

Figure 6:
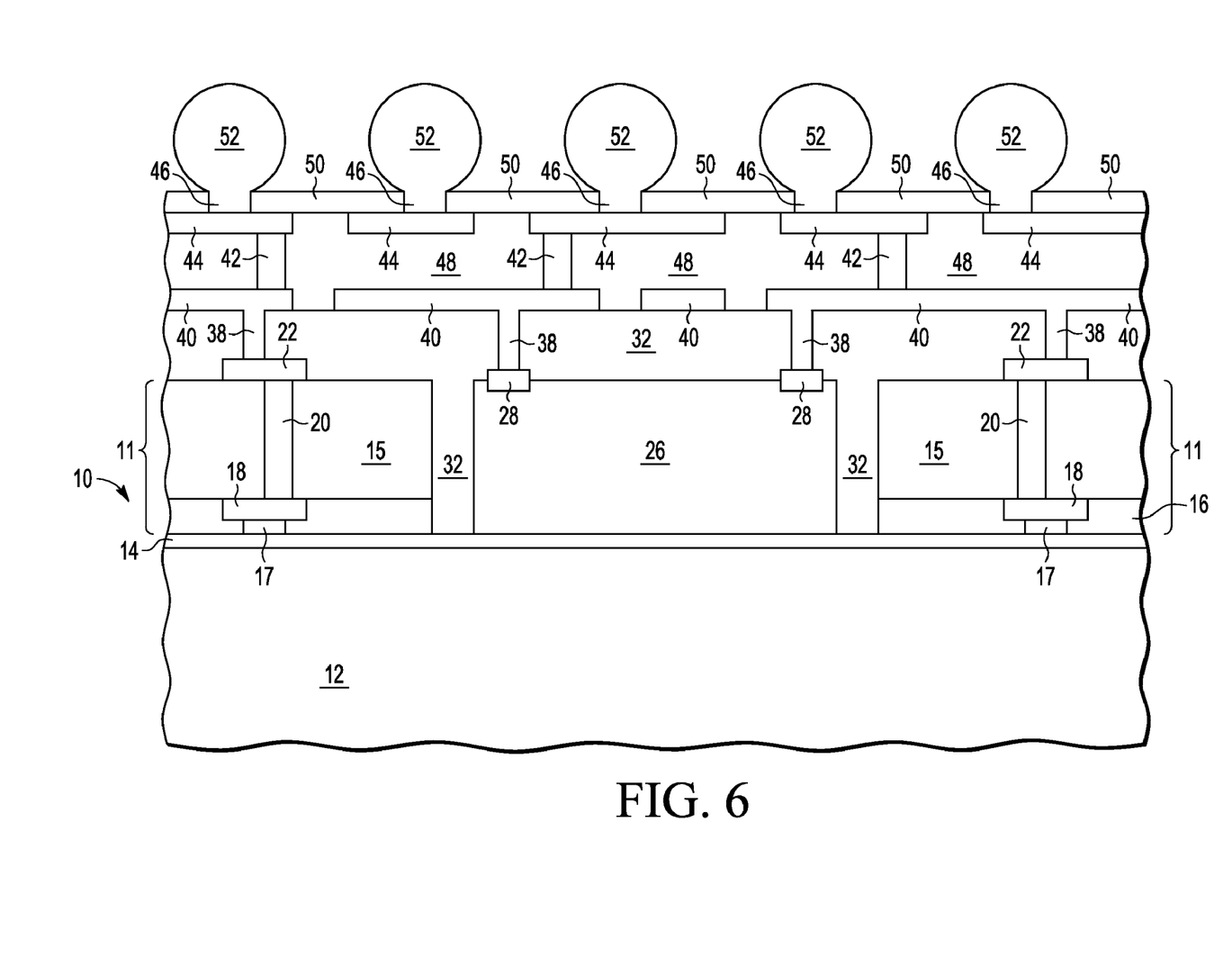
FIG. 6 illustrates the semiconductor device of FIG. 5 after forming interconnect layers and contact terminals in accordance with an embodiment.

FIG. 6 illustrates the semiconductor device of FIG. 5 after forming interconnect layers and contact terminals in accordance with an embodiment. The openings 34 and 36 may be filled with a conductive material, which may include copper, to form vias 38 at the same time first interconnect layer 40, which is a conductive material and may include copper, is formed and patterned. As a result, the vias 38 are in physical contact with and are electrically coupled to interconnect layer 40. In some cross-sectional views, such as that illustrated in FIG. 6, some first interconnect layers 40 will not appear to be electrically coupled to any vias 38; instead the first interconnect layer 40 will be coupled to a via that is in a different plane than that illustrated. A dielectric 48 is formed over the first interconnect layer 40. The dielectric 48 may be any suitable dielectric, such as WPR 1201 from JSR Corporation, a similar material, or combinations thereof. Openings for vias 42 are formed in the dielectric, for example, using photolithography and may be filled when the next conductive layer is applied. A second metal layer 44 is formed and patterned using similar processes and materials that can be used for the first metal layer 40. The vias 42 may be filled at the same time and electrically connect the first metal layer 40 to the second metal layer 44. A solder mask 50 is formed over the second metal layer. The solder mask 50 is patterned to form openings exposing portions of the conductive layer 44 that are later filled with solder or other solderable metallurgy 46. A terminal, such as a solder ball 52 as illustrated in FIG. 6, is formed. The solder from the solder balls 52 may fill the opening in the solder mask 50, as illustrated in FIG. 6. In other embodiments, other terminals may be used. For example, the solder ball 52 may be a hemisphere or the openings may be filled with a conductive material and this conductive material may be the terminal. The solder mask 50 is formed and patterned to define where the solder should and should not be formed. In other words, the solder mask 50 confines at least a portion of the solder or other conductive material for the terminals.

Figure 7:
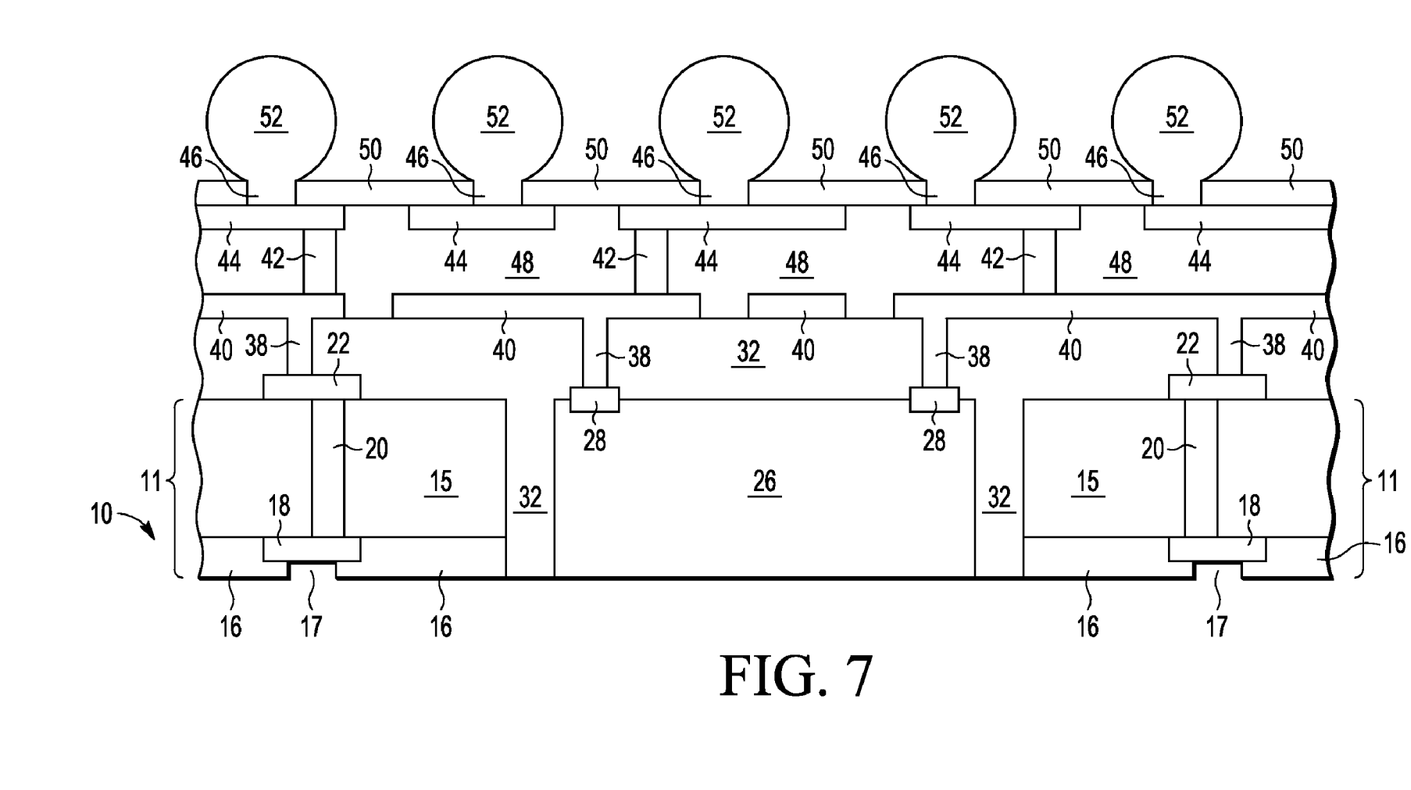
FIG. 7 illustrates the semiconductor device of FIG. 6 after removing a carrier and tape in accordance with an embodiment.

FIG. 7 illustrates the semiconductor of FIG. 6 after removing the carrier 12 and the tape 14 in accordance with an embodiment. The tape 14 and carrier 12 could be removed from the substrate 11 in one process step or separate process steps. This can be performed manually or be automated. After the carrier 12 and tape 14 are removed, the contact pads 18 are exposed through solder mask 16 and can be used to electrically couple another electrical device to the die 26 or other parts of the packaged semiconductor device 10.

Figure 8:
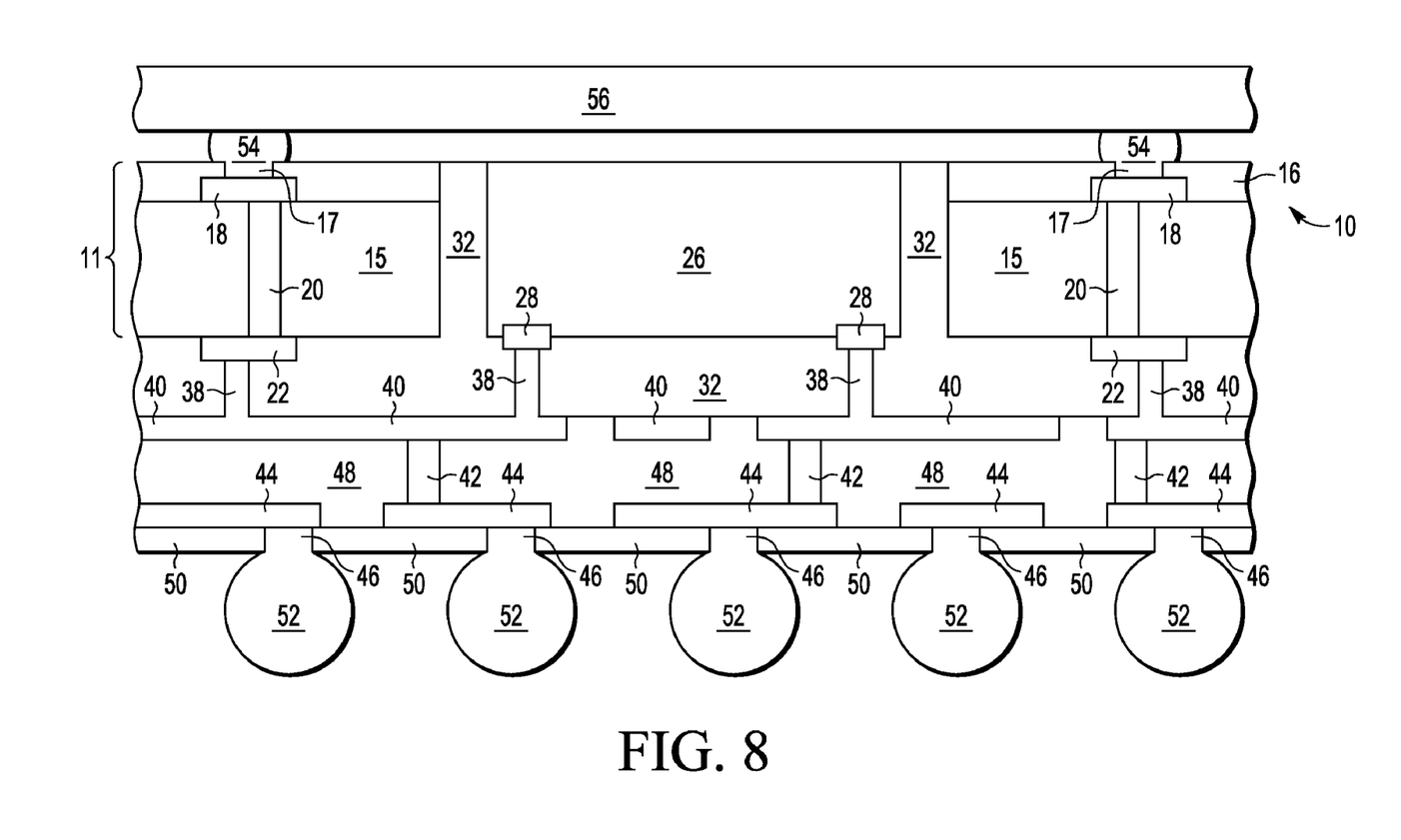
FIG. 8 illustrates the semiconductor device of FIG. 7 after attaching another package in accordance with an embodiment.

In the embodiment illustrated in FIG. 8, a package 56 having an electrical device or die 56 is attached to the semiconductor device 10 or more specifically is attached to the contact pad 18 via solder balls 54. Hence, the solder balls 54 electrically couple a die within the package 56 to the contact pad 18, vias 20 and contacts 22 and other metallization such as vias 38 and 42 and interconnect layers 40 and 44 and solder balls 52. The package 56 with solder balls 54 is just one example of an electrical device that can be coupled or stacked on to the semiconductor device 10. Any other package can be used. In addition, additional packages may be formed over or adjacent the package 56. Also, additional die or other electrical devices may be present adjacent the die 26.

By now it should be appreciated that there has been provided a method for forming a 3D packaged semiconductor device. The method involves placing at least one die active side up in a cavity formed in a (pre-built) substrate having pre-fabricated vias, routing circuits and contact pads. Damage to the packaged semiconductor device 10 is minimized because via drilling is avoided and warping during build up is minimized or reduced. Having routing & contact pads avoids the need for stacked vias. In addition, build up of layers may or may not be performed on the first major surface of substrate 11. In one embodiment, the build up of layers is performed on the first major surface of substrate 11 in addition to the second major surface. The contact structure for the stacked devices or a PCB board may be formed over the entire area of the first major surface to allow higher number of contact terminal or the smaller device on top of back side of die 26. In another embodiment, a recess may be formed with the pre-built substrate 11 rather than through the cavity 24 to receive the die 26. The contact pads 18 and openings 17 of substrate 11 may cover the entire area of the first major surface of substrate 11 to allow a high number of contact terminals or the smaller device on top of back side of die 26. Use of the pre-built substrate reduces the process steps needed for a 3D package and enables one or more stacked devices on the base package. In one embodiment, multiple 3D packaged semiconductor devices are stacked on top of each other.

Unless stated otherwise, terms such as "first" and "second" are used to arbitrarily distinguish between the elements such terms describe. Thus, these terms are not necessarily intended to indicate temporal or other prioritization of such elements.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the vias may include multiple materials, such as barrier layers and fill materials. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

What is claimed is:

1. A method of forming a packaged semiconductor device, comprising:
    providing a circuit board having a first major surface and a second major surface and an opening in the second major surface, first vias that extend between the first major surface and the second major surface, first contact pads terminating the vias at the first major surface, and second contact pads terminating the vias at the second major surface;
    attaching the circuit board to a carrier with a double-sided adhesive;
    placing a semiconductor device in the opening of the circuit board, wherein the semiconductor device has an active surface that is generally coplanar with the second major surface of the circuit board and wherein the active surface includes device contact pads;
    applying a photo-imageable dielectric layer over the active surface and sides of the semiconductor device and the second major surface of the circuit board;
    patterning the photo-imageable dielectric layer via selective exposure to expose the second contact pads of the circuit board and the semiconductor device contact pads;
    forming an interconnect layer over the photo-imageable dielectric layer, wherein the interconnect layer has second vias electrically connected to the second contact pads, third vias that are electrically connected to the contact pads on the active surface of the semiconductor device, an exposed surface, and third contact pads at the exposed surface; electrically connected to the second contact pads and the device contact pads
    forming a plurality of solder balls on the third contact pads connecting the packaged semiconductor device through all of the third contacts pads to a single substrate;
    removing the carrier from the circuit board; and
    attaching another packaged semiconductor device to the first contact pads at the first major surface.

2. The method of claim 1, wherein the circuit board is further characterized by having a solder mask layer on the first major surface, wherein the solder mask layer has openings at locations of the first contact pads.

3. The method of claim 2, further comprising attaching the another packaged semiconductor device by connecting contacts of the another packaged semiconductor device to the first contact pads through the openings at the locations of the first contact pads.

4. The method of claim 3, wherein the semiconductor device has a major surface opposite to the active surface.

5. The method of claim 1, wherein the step of forming the interconnect layer comprises forming conductive layers at a plurality of levels from the second major surface of the circuit board.

* * * * *